US009000384B2

(12) United States Patent
Conway et al.

(10) Patent No.: US 9,000,384 B2
(45) Date of Patent: Apr. 7, 2015

(54) MIXED IONIC-ELECTRONIC CONDUCTOR-BASED RADIATION DETECTORS AND METHODS OF FABRICATION

(75) Inventors: Adam Conway, Livermore, CA (US); Patrick R. Beck, Livermore, CA (US); Robert T. Graff, Modesto, CA (US); Art Nelson, Livermore, CA (US); Rebecca J. Nikolic, Oakland, CA (US); Stephen A. Payne, Castro Valley, CA (US); Lars Voss, Livermore, CA (US); Hadong Kim, Methuen, MA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 377 days.

(21) Appl. No.: 13/457,396

(22) Filed: Apr. 26, 2012

(65) Prior Publication Data

US 2013/0026364 A1    Jan. 31, 2013

Related U.S. Application Data

(66) Substitute for application No. 61/551,870, filed on Oct. 26, 2011.

(60) Provisional application No. 61/479,279, filed on Apr. 26, 2011.

(51) Int. Cl.
| | | |
|---|---|---|
| *G01T 1/24* | (2006.01) | |
| *B32B 9/00* | (2006.01) | |
| *C30B 29/12* | (2006.01) | |

(52) U.S. Cl.
CPC . *B32B 9/00* (2013.01); *C30B 29/12* (2013.01); *G01T 1/24* (2013.01)

(58) Field of Classification Search
CPC .............................. G01T 1/24; H01L 31/115
USPC .................................................. 250/370.01
See application file for complete search history.

(56) References Cited

U.S. PATENT DOCUMENTS

2008/0157255 A1*  7/2008  Kominami et al. ........... 257/459
2013/0126746 A1*  5/2013  Bolotnikov et al. ..... 250/370.13

OTHER PUBLICATIONS

Nakahara et al. "Edge emissions and broad band emissions in thallous halides", Journal of the physical society of Japan, vol. 40, No. 1, Jan. 1976.*

* cited by examiner

*Primary Examiner* — Marcus Taningco
*Assistant Examiner* — Mindy Vu
(74) *Attorney, Agent, or Firm* — James S. Tak (57) ABSTRACT

A method of fabricating a mixed ionic-electronic conductor (e.g. TlBr)-based radiation detector having halide-treated surfaces and associated methods of fabrication, which controls polarization of the mixed ionic-electronic MIEC material to improve stability and operational lifetime.

16 Claims, 8 Drawing Sheets

MIXED IONIC-ELECTRONIC CONDUCTOR-BASED RADIATION DETECTORS AND METHODS OF FABRICATION

CROSS-REFERENCE TO RELATED APPLICATIONS

This patent document claims the benefits and priorities of U.S. Provisional Application No. 61/479,279, filed on Apr. 26, 2011, and U.S. Provisional Application No. 61/551,870, filed on Oct. 26, 2011, both hereby incorporated by reference.

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

TECHNICAL FIELD

This patent document relates to ionizing radiation detecting materials, detectors, spectrometers and associated methods of fabrication. More particularly, the present invention relates to a mixed ionic-electronic conductor (e.g. TlBr)-based radiation detector having halide-treated surfaces and associated methods of fabrication, which controls polarization of the mixed ionic-electronic conductor material to improve stability and operational lifetime.

BACKGROUND

Thallium-bromide (TlBr) is a compound wide-bandgap semiconductor considered to be a promising room temperature X- and gamma-ray detector material due to its excellent spectroscopic performance, with resolutions of <1.2% having been demonstrated. Compared to the more common CZT (CdZnTe) room temperature detectors, TlBr is known to have about three times the gamma sensitivity, suggesting only one-third the volume of CZT would be needed to achieve a comparable response to gamma rays.

Figure 1:
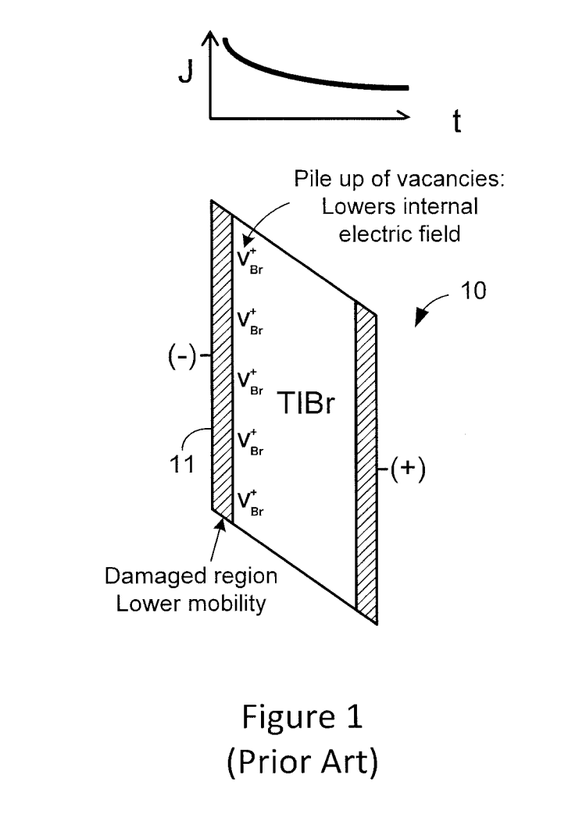
FIG. 1 shows a schematic diagram of a TlBr crystal under applied bias and having a surface damage layer, illustrating Bromine vacancy migration.

However, the use of TlBr as a room temperature radiation detector is limited by polarization of the TlBr crystal under applied bias causing a steady reduction in the internal field at room temperature and instability in dark current. The polarization phenomenon is attributed to the fact that TlBr is a mixed ionic-electronic conductor ("MIEC"). At room temperature, a large concentration of Schottky pairs of Tl and Br vacancies ($V_{Tl}^-$, $V_{Br}^+$) can easily form due to their low formation energy. Under an applied bias and at room temperature, ionic current can be significant and dominated by the migration of Br vacancies ($V_{Br}^+$), which have an extremely low energy of migration, rendering it highly mobile within the lattice. FIG. 1 illustrates Br vacancy migration toward the cathode in a TlBr crystal 10 under applied bias (anode not shown), and having a surface damage layer 11 where there is lower mobility. The resulting imbalance in the distribution of charged vacancies results in the build-up of an internal electric field that opposes the applied bias and thereby gradually decreases current and carrier collection efficiency (as shown by the graph charting current density in time in FIG. 1) and degrades spectroscopic performance.

Several approaches to reducing polarization and increasing stability are known. One approach is to cool the detectors down to about −15° C. or lower, which serves to decrease both the vacancy concentration and their mobility. Detectors operated at sufficiently lower temperature show no signs of degradation, even under long-term applied bias. Another approach is to apply Tl metal contacts to the crystals, and reverse the voltage polarity roughly every 24 hours in order to maintain stable operation. While both of these approaches serve to increase the operational lifetime of TlBr detectors, the first approach can be power intensive for portable devices due to the cooling requirement, and the second requires the use of Tl metal, which is highly toxic and can be readily absorbed through the skin. Moreover, switching of the voltage polarity adds to the complexity of the circuitry thus adding cost, and may not be compatible with single carrier charge sensing techniques.

Figure 2:
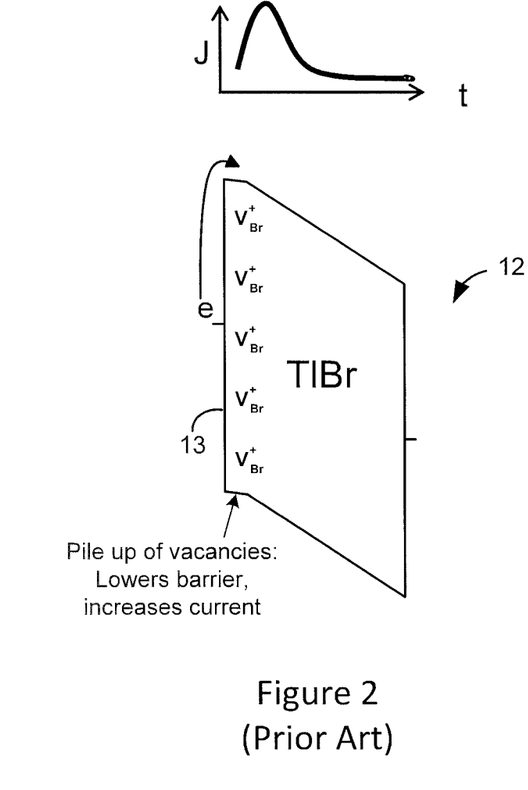
FIG. 2 shows a schematic diagram of a TlBr crystal under applied bias and having an $H_2O_2$ etch processed surface (after removing a surface damage layer), illustrating the lower barrier which increases current.

Surface quality of TlBr is also known to be a contributing factor of TlBr performance as a radiation detector. Because TlBr is a soft material, dislocations, non-equilibrium Tl and Br vacancies, and other structural defects are generated during crystal growth and mechanical processing (e.g. cutting and surface polishing) which can affect the electrical resistance, carrier diffusion and trapping, and deteriorate the quality of TlBr detectors. In a common process of TlBr preparation, a bromine methanol solution is used to chemically etch a mechanically polished TlBr surface to remove surface defects. And as described in the article "Surface Processing of TlBr for Improved Gamma Spectroscopy" by Voss et al (2010 IEEE), incorporated by reference herein, $H_2O_2$ etchant has also been used to remove surface damage. However, the use of both bromine-based etchants and $H_2O_2$ etchants can result in large, long lived current transients due to a buildup of the far more mobile Br vacancies at the cathode (negatively biased electrode), which lowers the barrier to electronic injection and degrades performance, as illustrated in FIG. 2 showing an example TlBr crystal 12 under applied bias and having an etch processed surface 13. FIG. 2 also shows a graph charting current density in time and showing the domination of electronic injection due to build up of extrinsic vacancies. While after a period of time, the current eventually returns to its original value (i.e. "field annealing") and does not increase again and is relatively stable, during this period of high current the TlBr detector is inoperable due to the large noise floor. Additionally, the detectors eventually begin to degrade even when this transient has passed, thus limiting the operational lifetime Thus, an alternative method to control the polarization of these MIEC-based detectors is desired which address and controls the polarization phenomena and substantially eliminates large current transients to enable long term stability and operation.

SUMMARY

In one implementation of the present invention, a method is provided for fabricating a mixed ionic-electronic conductor (MIEC)-based radiation detector, by forming a halide-treated surface on a MIEC crystal to increase the stability and resistance to degradation of the MIEC crystal under an applied bias.

In another implementation of the present invention, a mixed ionic-electronic conductor (MIEC)-based radiation detector is provided comprising a MIEC crystal having a halide-treated surface to increase the stability and resistance to degradation of the MIEC crystal under an applied bias.

In another implementation of the present invention, a method is provided for fabricating a mixed ionic-electronic conductor (MIEC)-based radiation detector, by forming a cathode and an anode on a MIEC crystal, wherein the cathode and anode material are each a metal having an oxidation state selected from the group consisting of 2, 4, 5, and 6, except the anode metal does not have an oxidation state of 2.

In another implementation of the present invention, a mixed ionic-electronic conductor (MIEC)-based radiation detector is provided comprising a MIEC crystal with a cathode and an anode formed thereon, wherein the cathode and anode materials are each a metal having an oxidation state selected from the group consisting of 2, 4, 5, and 6, except an anode metal does not have an oxidation state of 2.

These and other implementations and various features and operations are described in greater detail in the drawings, the description and the claims.

Generally, the technology described in this patent document includes MIEC-based ionizing radiation (e.g. X- and gamma-ray) detectors, such as for example TlBr detectors, as well as the methods, devices, and systems for fabricating such detectors in a manner which improves stability in room temperature operation and ultimately the detector's operational lifetime. It is appreciated that MIEC crystals are materials with simultaneous ionic and electronic conduction, and play an important role in many electrochemical applications, such as for example, fuel cells, ceramic oxygen separation membranes, or conductometric oxygen sensors. Various types of MIEC crystal may be used for the present invention, including for example TlBr, TlCl, TlI, and ternary compositions thereof (such as for example TlBrF or TlBrCl). TlBr in particular is used herein as a representative MIEC crystal to describe the various aspects of the present invention.

One general method of fabricating the MIEC-based radiation detector of the present invention to improve stability and resist degradation includes forming a halide-treated surface on the MIEC crystal so as to form a surface heterojunction. In the case where the MIEC is a TlBr crystal, a TlBrF or TlBrCl surface formed on a TlBr crystal effectively suppresses electronic injection than can occur when surface damage is removed from the crystals. Forming of the TlBrF or TlBrCl surface on the TlBr crystal may be accomplished by incorporating fluorine or chlorine, respectively, into a TlBr surface of the TlBr crystal, or alternatively, by depositing TlBrF or TlBrCl, respectively, on a TlBr surface of the TlBr crystal. In the case where fluorine or chlorine is incorporated into a TlBr surface of the crystal, two example methods may be employed. For example, one method of incorporating fluorine or chlorine, respectively, into a TlBr surface of the TlBr crystal is by wet etching the TlBr surface of the TlBr crystal with a chemical containing fluorine or chlorine, respectively to remove a surface damage layer. Alternatively, in another example method of incorporating fluorine or chlorine, respectively, into a TlBr surface of the TlBr crystal is by implanting fluorine or chlorine ions, respectively, into the TlBr surface of the TlBr crystal. In any case, such halide-treated surfaces, and the resulting halide treated regions therebelow, enable stable operation of TlBr detectors for long periods of time.

Another general method of fabricating the MIEC-based radiation detector of the present invention to improve stability and resist degradation includes the formation of electrodes on the MIEC crystal, where the metals used for the electrodes are selected based on their oxidation states to minimize diffusion

DETAILED DESCRIPTION

Figure 3:
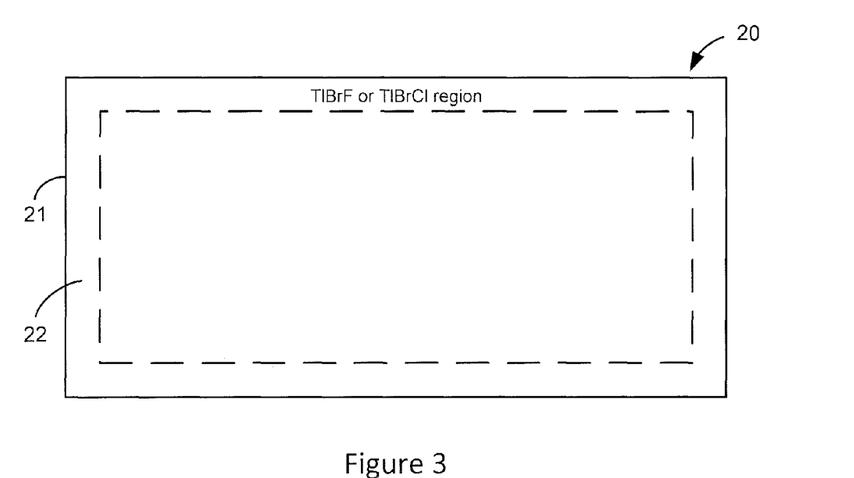
FIG. 3 shows a schematic diagram of an example embodiment of a MIEC crystal (e.g. TlBr crystal) of the present invention having a halide-treated surface (e.g. TlBrF or TlBrCl) formed on the MIEC crystal.
Figure 4:
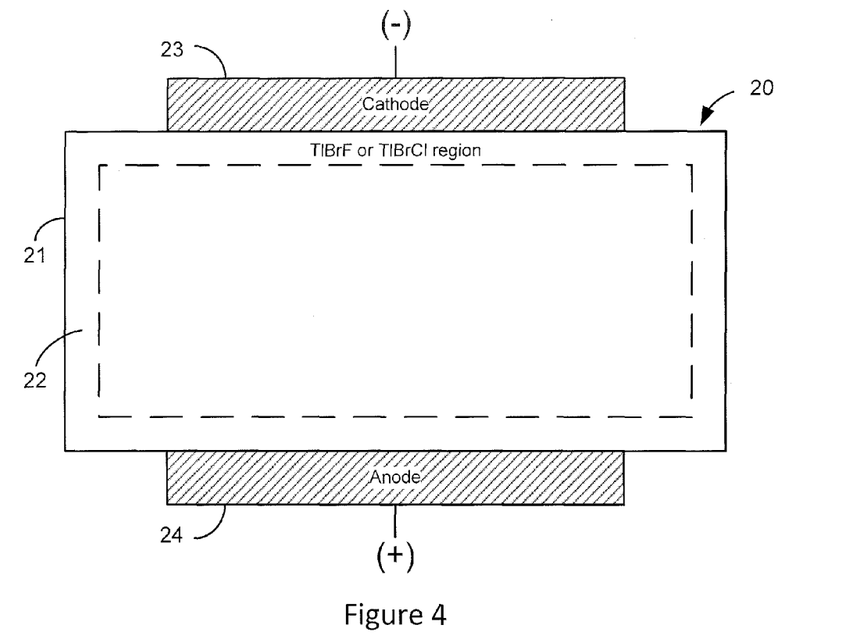
FIG. 4 shows a schematic diagram of the example embodiment of FIG. 3 with electrodes formed on the halide-treated surface.

Turning now to the drawings, FIG. 3 generally shows a MIEC crystal, i.e. a TlBr crystal 20, having a halide-treated surface, i.e. a TlBrF or TlBrCl surface 21 and a halide-treated region, i.e. TlBrF or TlBrCl region 22, beneath the surface 21 that is fabricated according to the methods of the present invention. And FIG. 4 shows the MIEC crystal 20 further fabricated with electrodes 23 and 24 formed on the TlBrF or TlBrCl surface 21 for applying a bias. The various methods described herein are intended to produce these basic constructions of the radiation detector shown in FIGS. 3 and 4.

Figure 5:
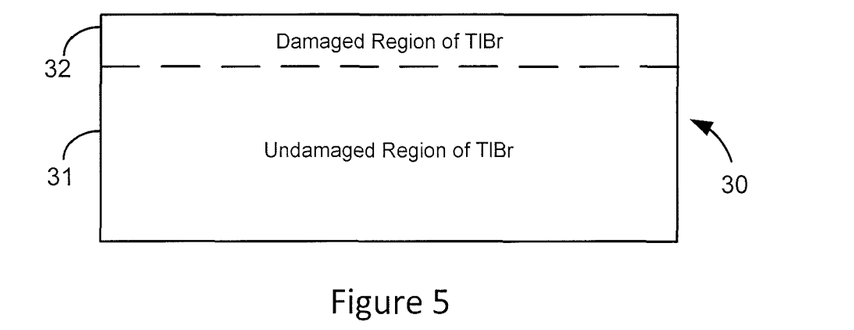
FIGS. 5-7 show a series progression of schematic diagrams illustrating an example embodiment for forming a halide-treated surface via wet etching.
Figure 6:
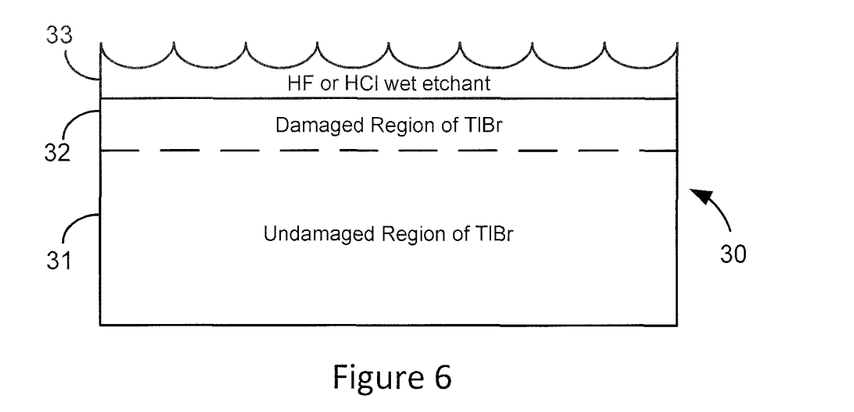
Figure 7:
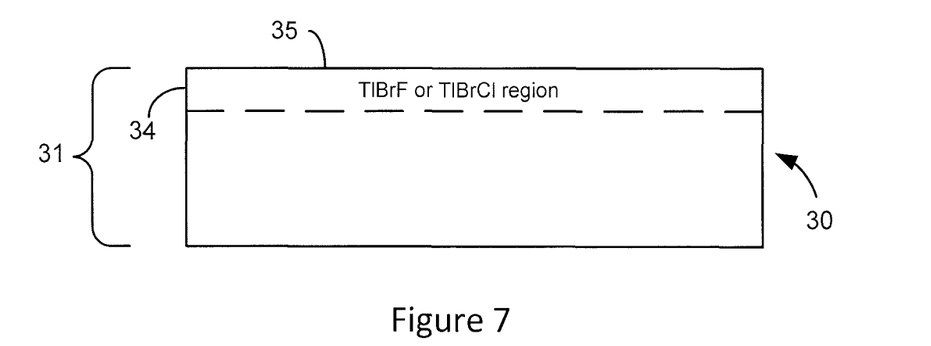

FIGS. 5-7 together show one example embodiment of a method for fabricating the MIEC radiation detector of the present invention by forming a halide-treated surface on a MIEC crystal to create a surface heterojunction to suppress current injection. In particular, FIGS. 5-7 show a TlBr crystal 30 having an undamaged region 31 and a surface damage layer 32. It is appreciated that while the surface damage layer 32 is shown on only one side of the crystal, it may encompass the crystal on all sides (though not shown in the figures), and processing of the surface damage layer may therefore be performed on all sides. The formation of a halide-treated surface (and in particular either a TlBrF or TlBrCl surface) shown in FIG. 6 uses a HF or HCl wet etchant 33 to remove the surface damage layer 32, so that a TlBrF or TlBrCl surface 35, respectively, remains. The TlBrF or TlBrCl surface 35 bounds a TlBrF or TlBrCl region 34 just below the surface which forms a surface heterojunction. Various etchant solutions containing fluorine or chlorine may be used, such as for example HF, HCl, SOCl2, etc. Preferably, the TlBrF or TlBrCl surfaces and region have a ratio of Cl or F to Br of greater than 0 to increase stability of the TlBr radiation detector. The advantage of a wet etch method is that it combines the removal of surface damage and the creation of a heterojunction in a single process to increased injection barrier and create a stable gamma response.

Figure 8:
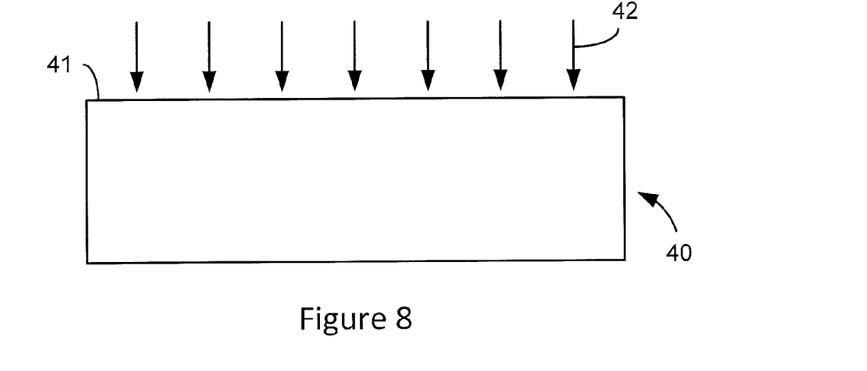
FIG. 8-9 show a series progression of schematic diagrams illustrating an example embodiment for forming a halide-treated surface via ion implantation.
Figure 9:
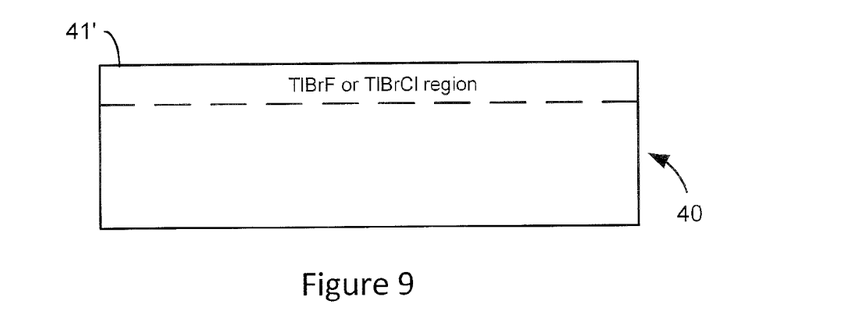

FIGS. 8-9 show another example embodiment of a method for forming a halide-treated surface on a MIEC crystal, i.e. TlBr, by implanting, halide anions, such as for example fluoride and chloride, from sources such as for example plasma, ion implanters, etc. In particular, the TlBr crystal 40 is shown having a TlBr crystal surface 41. Fluoride or chloride ions are implanted into the MIEC crystal surface as indicted by arrows 42, to form the halide-treated surface, in particular 41'.

Figure 10:
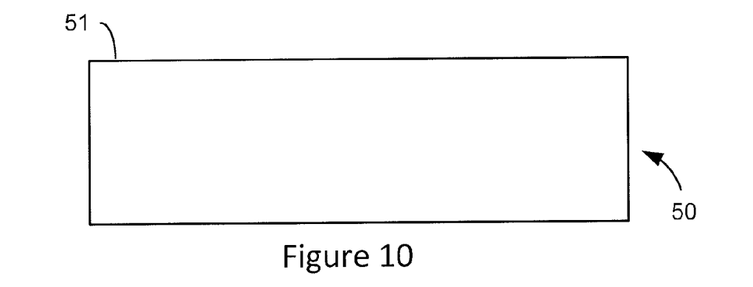
FIGS. 10-11 show a series progression of schematic diagrams illustrating an example embodiment for forming a halide-treated surface via depositition of a halide-containing material.
Figure 11:
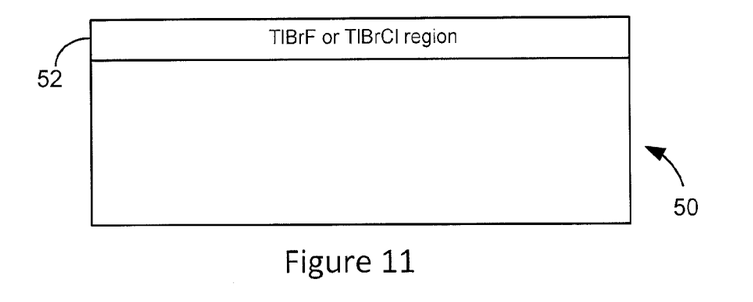

FIGS. 10-11 show another example embodiment of a method for forming a halide-treated surface on a MIEC crystal by depositing a halide-treated material on a MIEC crystal surface, such as for example, by sputtering, evaporation, physical vapor deposition, etc. In particular, the MIEC crystal 50 is shown having a MIEC crystal surface 51, upon which the deposition layer 52 is formed.

Figure 12:
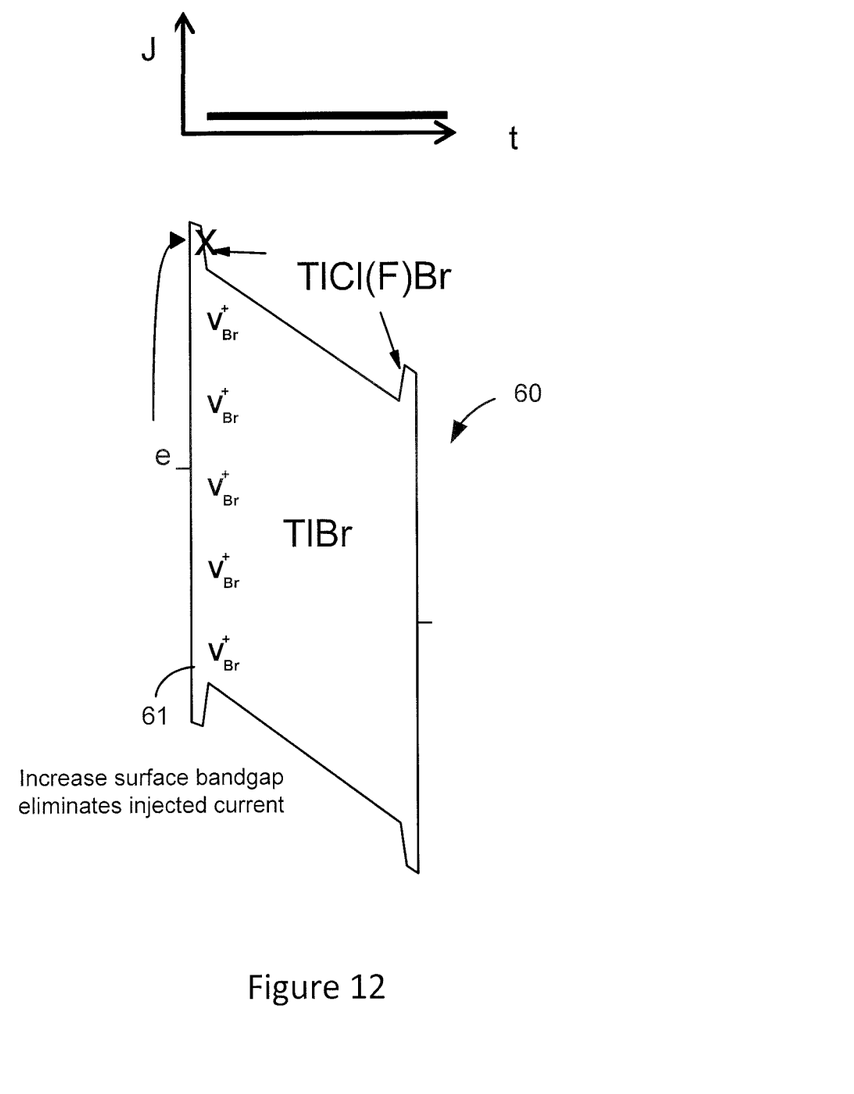
FIG. 12 shows a schematic diagram of an example embodiment of a TlBr crystal of the present invention under applied bias and having a halide-treated surface with increased surface bandgap and substantially eliminating injected current.

FIG. 12 shows a schematic diagram of an example embodiment of a TlBr crystal of the present invention under applied bias and having a halide-treated surface with increased surface bandgap and illustrating how it substantially eliminates injected current. In particular, the TlBr crystal 60 is shown having a halide-treated surface 61 which enables long term response to be improved by decoupling degradation of the gamma performance from the current-voltage relationship.

Figure 13:
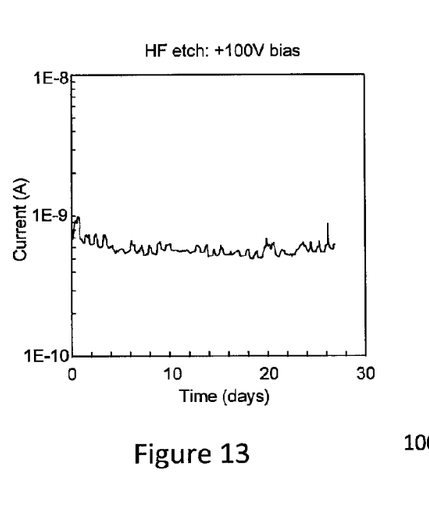
FIG. 13 shows a graph plotting current vs time, illustrating current stability under bias of a TlBr crystal etched with HF.
Figure 14:
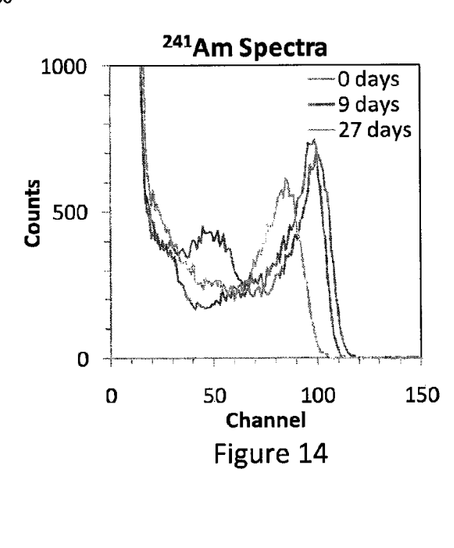
FIG. 14 shows a graph plotting counts vs time, illustrating the long term stability of [241]Am count measurements of TlBr detectors surface treated with HF.
Figure 15:
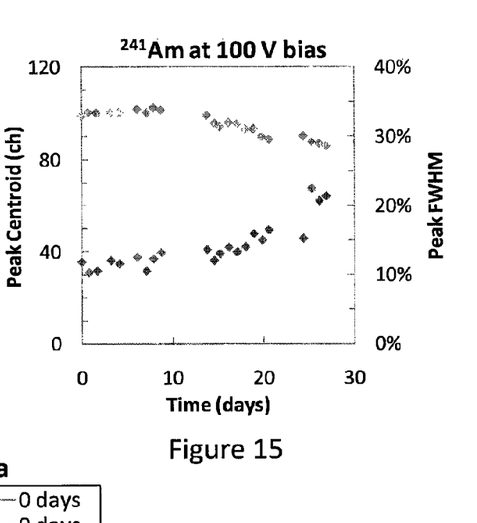
FIG. 15 shows a graph plotting peak centroid vs time, illustrating the long term stability of [241]Am peak centroid position of TlBr detectors surface treated with HF.
Figure 16:
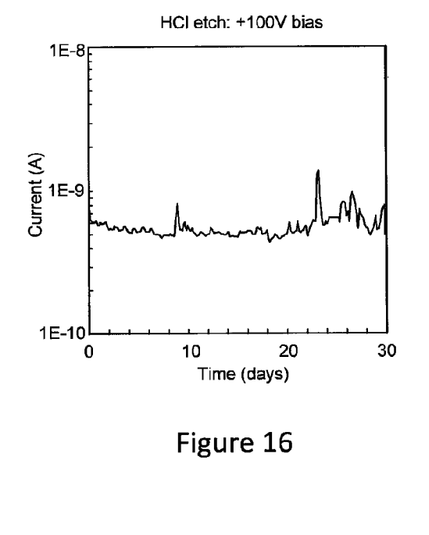
FIG. 16 shows a graph plotting current vs time, illustrating current stability under bias of a TlBr crystal etched with HCL.
Figure 17:
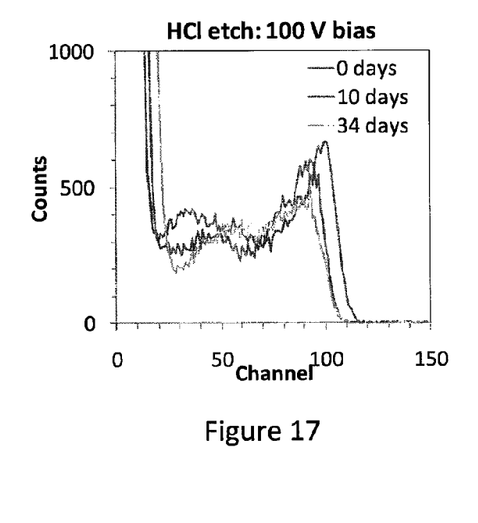
FIG. 17 shows a graph plotting counts vs time, illustrating the long term stability of [241]Am count measurements of TlBr detectors surface treated with HCl.
Figure 18:
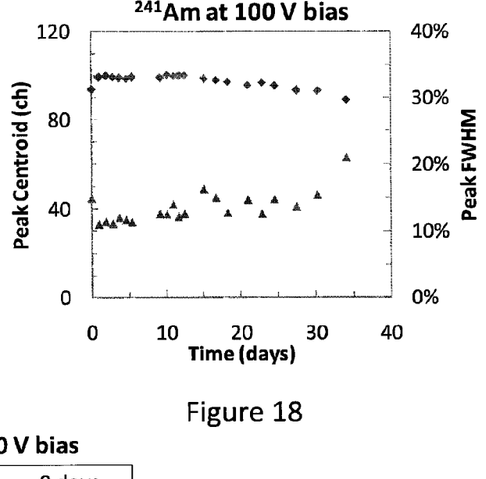
FIG. 18 shows a graph plotting peak centroid vs time, illustrating the long term stability of [241]Am peak centroid position of TlBr detectors surface treated with HCl.

Experiments were performed using planar gamma spectrometers fabricated according to the method of the present invention, which suggest stable current response over several weeks of continual 2000V/cm fields at room temperature. In particular, FIGS. 13-15 show the long term performance results of TlBr having an HF etched surface, and FIGS. 16-19 show the long term performance results of TlBr having an HClk etched surface. In both cases, stable gamma response at 100V were observed for 21 days under 2000 V/cm using conventions Au electrodes.

Figure 19:
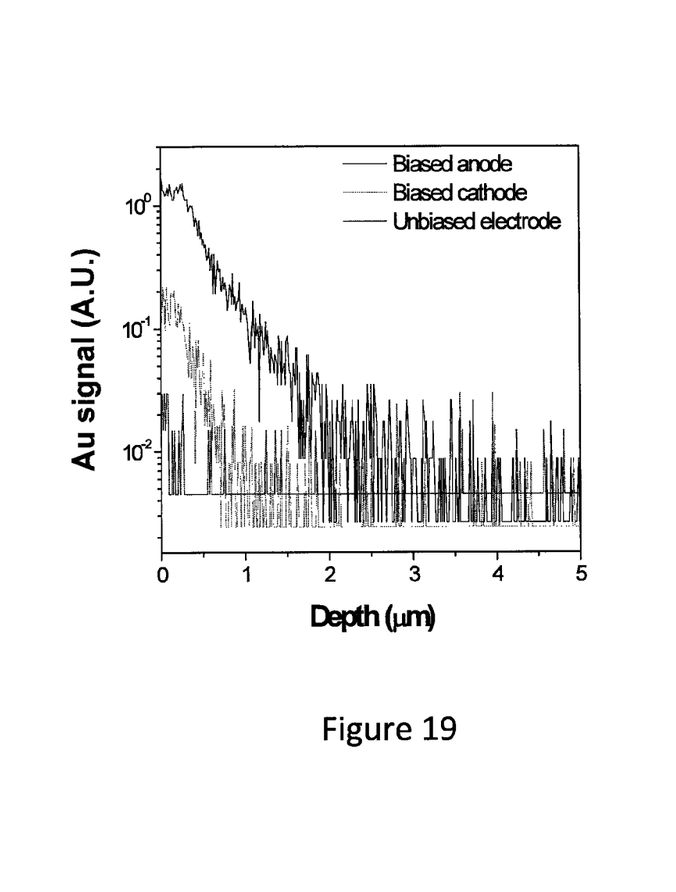
FIG. 19 show SIMS results of Au incorporation into planar TlBr detector after 30 days of operation at 2000V/cm. The Au is diffusing farther into the anode and at higher concentration.
Figure 20:
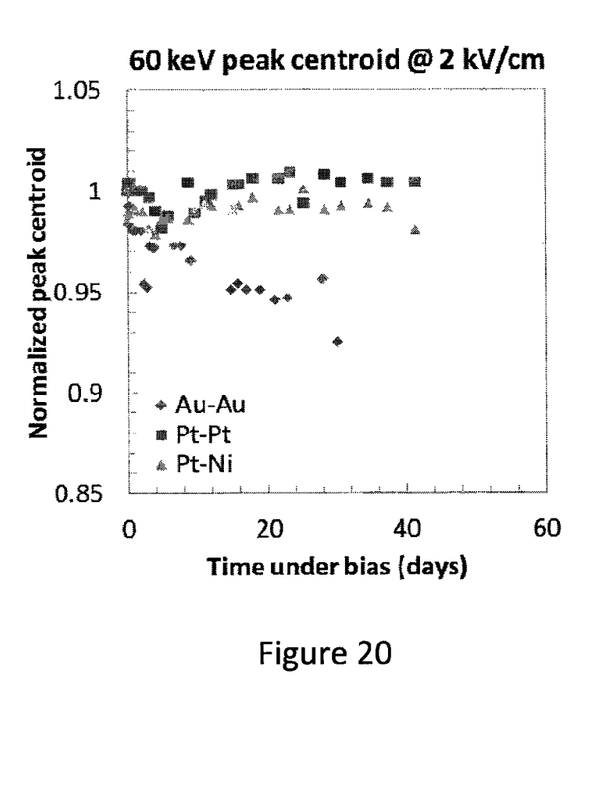
FIG. 20 shows a graph plotting normalized peak centeroid vs time under bias, illustrating the long term stability of [241]Am peak centroid position of TlBr detectors with different electrode configurations measured at 2000 V/cm at room temperature and stressed at 4000V/cm.

It has also been observed that the metal electrode can diffuse into the TlBr causing degradation and instability in performance. XPS beneath and around Au contacts used in experiments reveals the formation of Au—Br bonds at the anode and Tl rich surfaces at the cathode. In addition, the areas around and underneath electrodes have been examined using XPS and it has been found that the cathode becomes Tl rich while the anode become Br rich, with Au—Br bonds formed at the anode. These may lead to degradation of detector performance Therefore, by utilizing the appropriate metal electrode configuration where by the electric field enhanced diffusion of metal into the TlBr can be minimized, the stable operating time can be increased. The choice of metals for the anode and cathode is governed by the allowed oxidation states of those metals and thus their ability for form compounds with the TlBr's constituent elements, their diffusivity within TlBr under applied electric field, and the electronic states that they introduce. Specifically the oxidation states for the anode metal should be 4, 5 or 6 while the cathode should be 2 or 4, shown schematically in FIG. 2. In addition, metals which do not diffuse far into the TlBr and which do not introduce electronic states within the forbidden gap are also preferred. Detectors with various metal electrodes, such as Pt anode and Pt cathode, Pt anode and Ni cathode have been fabricated and characterized, and compared against an Au anode and Au cathode. The most energetically favorable oxidation states for these metals are 4, 2 and 3 for Pt, Ni and Au respectively. The long term gamma detection performance for an Am-241 source is shown in FIGS. 19 and 20 for TlBr detectors under 4000V/cm bias.

Although the description above contains many details and specifics, these should not be construed as limiting the scope of the invention or of what may be claimed, but as merely providing illustrations of some of the presently preferred embodiments of this invention. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

We claim:

1. A method of fabricating a mixed ionic-electronic conductor (MIEC)-based radiation detector, comprising:
   forming a halide-treated surface on a MIEC crystal to increase the stability and resistance to degradation of the MIEC crystal under an applied bias, wherein the MIEC crystal is TlBr crystal, and the halide-treated surface is one of a TlBrF or TlBrCl surface.

2. The method of claim 1,
   wherein the TlBr crystal is a ternary compositions of TlBr.

3. The method of claim 1,
   wherein the step of forming the TlBrF or TlBrCl surface on the TlBr crystal comprises incorporating fluorine or chlorine, respectively, into a TlBr surface of the TlBr crystal.

4. The method of claim 3,
   wherein the step of incorporating fluorine or chlorine comprises wet etching the TlBr surface of the TlBr crystal with a chemical containing fluorine or chlorine, respectively to remove a surface damage layer.

5. The method of claim 3,
   wherein the step of incorporating fluorine or chlorine comprises implanting fluorine or chlorine ions, respectively, into the TlBr surface of the TlBr crystal.

6. The method of claim 1,
   wherein the step of forming the TlBrF or TlBrCl surface on the TlBr crystal comprises depositing TlBrF or TlBrCl, respectively, on a TlBr surface of the TlBr crystal.

7. The method of claim 1,
   further comprising forming a cathode on the halide-treated surface, wherein the cathode material comprises a metal having an oxidation state selected from the group consisting of 2, 4, 5, and 6.

8. The method of claim 7,
   wherein the metal is selected from the group consisting of Pt and Ni.

9. The method of claim 1,
   further comprising forming an anode on the halide-treated surface, wherein the anode material comprises a metal having an oxidation state selected from the group consisting of 4, 5, and 6.

10. The method of claim 9,
    wherein the metal is selected from the group consisting of Pt.

11. A mixed ionic-electronic conductor (MIEC)-based radiation detector comprising:
    a MIEC crystal having a halide-treated surface to increase the stability and resistance to degradation of the MIEC crystal under an applied bias,
    wherein the MIEC crystal is TlBr crystal, and the halide-treated surface is one of a TlBrF or TlBrCl surface.

12. The mixed ionic-electronic conductor (MIEC)-based radiation detector of claim 11,
    wherein the TlBr crystal is a ternary compositions of TlBr.

13. The mixed ionic-electronic conductor (MIEC)-based radiation detector of claim 11,
    further comprising a cathode formed on the halide-treated surface, wherein the cathode comprise a metal having an oxidation state selected from the group consisting of 2, 4, 5, and 6.

14. The mixed ionic-electronic conductor (MIEC)-based radiation detector of claim 13,
    wherein the cathode comprises a metal selected from the group consisting of Pt and Ni.

15. The mixed ionic-electronic conductor (MIEC)-based radiation detector of claim 11,
    further comprising an anode formed on the halide-treated surface, wherein the anode comprise a metal having an oxidation state selected from the group consisting of 4, 5, and 6.

16. The mixed ionic-electronic conductor (MIEC)-based radiation detector of claim 15,
    wherein the anode comprises Pt.

* * * * *